United States Patent
Furuse et al.

(10) Patent No.: US 8,576,887 B2
(45) Date of Patent: Nov. 5, 2013

(54) SEMICONDUCTOR LASER DRIVING UNIT, OPTICAL SCANNER HAVING SEMICONDUCTOR LASER DRIVING UNIT, AND IMAGE FORMING APPARATUS

(75) Inventors: Katsuhisa Furuse, Hyogo (JP); Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/044,726

(22) Filed: Mar. 10, 2011

(65) Prior Publication Data

US 2011/0228802 A1    Sep. 22, 2011

(30) Foreign Application Priority Data

Mar. 18, 2010    (JP) ................................. 2010-061896

(51) Int. Cl.
*H01S 3/00*    (2006.01)

(52) U.S. Cl.
USPC ............... 372/38.02; 372/38.01; 372/29.011; 372/29.015

(58) Field of Classification Search
USPC ................... 372/38.02, 38.01, 38.07, 29.011, 372/29.015
See application file for complete search history.

(56) References Cited

U.S. PATENT DOCUMENTS

| | | | | |
|---|---|---|---|---|
| 4,835,780 A * | 5/1989 | Sugimura et al. | .......... | 372/29.01 |
| 6,388,689 B1 * | 5/2002 | Toda et al. | .................... | 347/132 |
| 6,954,415 B2 * | 10/2005 | Masui et al. | ............... | 369/59.11 |
| 7,372,882 B2 * | 5/2008 | Horiuchi et al. | .......... | 372/38.02 |
| 7,697,583 B2 * | 4/2010 | Furukawa et al. | .......... | 372/38.02 |
| 7,701,480 B2 * | 4/2010 | Omori et al. | .................... | 347/237 |
| 7,792,166 B2 * | 9/2010 | Borschowa | ................ | 372/38.04 |
| 2005/0069002 A1 * | 3/2005 | Senga et al. | ................ | 372/38.01 |
| 2005/0213623 A1 * | 9/2005 | Ozasa et al. | ................ | 372/38.02 |
| 2005/0243879 A1 * | 11/2005 | Horiuchi et al. | ........... | 372/38.07 |
| 2006/0120419 A1 * | 6/2006 | Takahashi et al. | ......... | 372/38.01 |
| 2008/0013578 A1 * | 1/2008 | Moriya | ....................... | 372/38.02 |
| 2008/0084469 A1 * | 4/2008 | Okada | ........................... | 347/236 |
| 2010/0027574 A1 * | 2/2010 | Fujita et al. | ................ | 372/38.02 |
| 2010/0074283 A1 * | 3/2010 | Ikegami | .......................... | 372/24 |
| 2010/0260219 A1 * | 10/2010 | Daio et al. | ................. | 372/38.02 |
| 2011/0228037 A1 * | 9/2011 | Omori et al. | ................... | 347/247 |

FOREIGN PATENT DOCUMENTS

| | | |
|---|---|---|
| JP | 2001-96794 | 4/2001 |
| JP | 2006-68933 | 3/2006 |
| JP | 2008-213246 | 9/2008 |

* cited by examiner

*Primary Examiner* — Jessica Stultz
*Assistant Examiner* — Delma R Forde
(74) *Attorney, Agent, or Firm* — Cooper & Dunham LLP

(57) ABSTRACT

Disclosed is a semiconductor laser driving unit that outputs a driving current for driving a semiconductor laser. A value of a correction current is set in such a manner as to determine a rising characteristic and/or a falling characteristic of an output of the driving current in accordance with a value of the driving current.

10 Claims, 17 Drawing Sheets

SEMICONDUCTOR LASER DRIVING UNIT, OPTICAL SCANNER HAVING SEMICONDUCTOR LASER DRIVING UNIT, AND IMAGE FORMING APPARATUS

BACKGROUND OF THE INVENTION

1. Field of the Invention

The present invention generally relates to semiconductor laser driving units, optical scanners having the semiconductor laser driving units, and image forming apparatuses using the semiconductor laser driving units. In particular, the present invention relates to a semiconductor laser driving unit capable of supplying a driving current having an ensured overshoot amount or an ensured undershoot amount to a semiconductor laser, an optical scanner having the semiconductor laser driving unit, and an image forming apparatus such as a laser printer using the semiconductor laser driving unit.

2. Description of the Related Art

A known image forming apparatus such as a laser printer uses a semiconductor laser. In this case, the image forming apparatus generally has a semiconductor laser scanner and rotates a photosensitive drum to have a latent image formed thereon while scanning the drum along its shaft direction with a polygon scanner (e.g., polygon mirror).

FIG. 1 is a diagram showing an image forming apparatus described in JP-A-2001-096794 (Patent Document 1).

In FIG. 1, reference numeral 32 denotes a scanning and exposing apparatus (semiconductor laser scanner), reference numeral 22 denotes a photosensitive drum, and reference numeral 16 denotes a sheet onto which a toner image is transferred.

The semiconductor laser scanner 32 has a semiconductor laser (referred also to as laser diode (LD)) 50 and a rotating polygon mirror 52 that reflects a laser beam emitted from the semiconductor laser 50 as a light source and applies the laser beam to the photosensitive drum 22.

The semiconductor laser 50 is connected to a semiconductor laser driving unit 54 described below and controlled to emit the laser beam according to image data.

The laser beam emitted from the semiconductor laser 50 is converted from diffuse rays into parallel rays by a collimating lens 56 and incident on the rotating polygon mirror 52, which rotates in a direction as indicated by arrow D about a rotating shaft 60, via a cylinder lens 58.

The angle of the laser beam incident on each of reflecting surfaces 52A is continuously changed and deflected. Thus, the laser beam is scanned in the shaft-line direction (direction as indicated by arrow E, i.e., main scanning direction) of the photosensitive drum 22 to be applied thereto.

Using an f-θ lens 62 composed of a first lens 62A and a second lens 62B provided in the traveling direction of the laser beam reflected by the rotating polygon mirror 52, the semiconductor laser scanner 32 scans the photosensitive drum 22 with the laser beam at a constant speed and forms an image on the peripheral surface of the photosensitive drum 22. The laser beam that passes through the f-θ lens 62 is bent by a reflective mirror 64 to irradiate the photoreceptor body 22.

A mirror 66 is arranged on the upstream side of the traveling direction and the main scanning direction of the laser beam, and a photo detector 68 is arranged in a direction in which the laser beam is reflected by the mirror 66. The photo detector 68 detects an application start timing (i.e., SOS (Start of Scan)) for each line at which the semiconductor laser scanner 32 applies the laser beam to the photosensitive drum 22.

The semiconductor laser driving unit 54 has a bias current source from which a bias current having a prescribed current value is fed to the semiconductor laser 50, a switching current source from which a switching current having a prescribed current value is fed to the semiconductor laser 50, and an overshoot generation circuit that generates an overshoot at the rising of a semiconductor laser driving current.

Note that the value of the bias current is set to be less than the value of a threshold current required when the semiconductor laser 50 outputs coherent light. Further, the value of the switching current is set to be added to the value of the bias current to be greater than the threshold current required when the semiconductor laser 50 outputs the coherent light. In other words, the ON/OFF state of the semiconductor laser 50 is based on whether the switching current is fed.

The semiconductor laser driving unit 54 feeds a set driving current (Iop) to the semiconductor laser 50 and controls the semiconductor laser 50 to illuminate at a prescribed light amount.

FIG. 2 is a graph showing a relationship between the driving current of a semiconductor laser and the amount of light output from the semiconductor laser. As shown in FIG. 2, the semiconductor laser has the characteristic of outputting coherent light when a driving current Iop becomes equal to or greater than a threshold current (denoted as Ith) and changing its light amount with a constant inclination as the driving current Iop increases. Here, a light emitting current, which is fed after the threshold current Ith to obtain the light amount becomes 1 mW, is denoted as Iη.

Generally, the light output waveform of a semiconductor laser used in an image forming apparatus such as a laser printer is ideally a rectangular waveform as shown in FIG. 3. However, if a distortion occurs in the driving current Iop, a distortion also occurs in the light output waveform of the semiconductor laser. Consequently, the light output waveform of the semiconductor laser becomes a blunt waveform having a round shape at its rising as shown in FIG. 4.

In the case of the blunt waveform shown in FIG. 4, an average light amount of the semiconductor laser becomes smaller compared with the case of the rectangular waveform shown in FIG. 3 in proportion to the degree of the round shape, which results in the disorder of a dot image as a generated image and reduction in image quality. This phenomenon is remarkable if the output waveform of a semiconductor laser becomes blunt at its rising when the frequency of data and the duty of a pulse become small at the input of image data.

It is ideal to output the rectangular waveform shown in FIG. 3 but the driving current Iop cannot rapidly rise due to the presence of a parasitic capacitance. Therefore, the output of such an ideal rectangular waveform is not possible. In addition, since the semiconductor laser has a parasitic capacitance, the output waveform becomes the blunt light output waveform as shown in FIG. 4.

In order to avoid this problem, there has been often employed, as described in, for example, JP-A-2001-096794 (Patent Document 1) and JP-A-2006-068933 (Patent Document 2), a method of using a snubber circuit to constitute an overshoot circuit controlled by a pulse smaller than an image data pulse and overlapping an overshoot current with the driving current Iop to generate an overshoot at the rising of the driving current Iop.

Due to the generation of the overshoot, the driving current Iop becomes one as shown in FIG. 5. Accordingly, the driving current Iop can rise earlier. In addition, since the parasitic capacitance is charged earlier, the semiconductor laser can increase an average light amount in its light output waveform.

Further, it is generally ideal to output the rectangular waveform shown in FIG. 10 to drop the driving current Iop. In this case, however, an error in light amount may occur if the driving current Iop becomes blunt at its fall as shown in FIG. 6. Further, an error may occur in a next driving current Iop to reduce image quality if the driving current Iop is not secured until next data are given. Moreover, light may be erroneously emitted if the driving current Iop does not fall below the threshold current Ith.

It is ideal to output the rectangular waveform shown in FIG. 3 but the driving current Iop cannot rapidly fall due to the presence of a parasitic capacitance as in the case of rising the driving current Iop. Therefore, the output of such an ideal rectangular waveform is not possible.

In order to avoid this problem, there has been often employed, as a known technology, a method of attracting from the driving current Iop an undershoot current with which an undershoot is generated at the falling of the driving current Iop.

However, if the snubber circuit having a resistor and a capacitance is used outside a semiconductor chip, a manufacturing cost is increased with an increase in the number of components. Further, if the snubber circuit is incorporated in the semiconductor chip, the manufacturing cost is also increased with an increase in the area of the semiconductor chip.

In view of this problem, consideration is given to a circuit that generates an overshoot at the rising of a driving current and an undershoot at the falling of the driving current inside a semiconductor chip.

Here, FIG. 7 shows output waveforms corresponding to the respective sizes (Iop1, Iop2, and Iop3) of a prescribed driving current Iop when a constant overshoot current and a constant undershoot current are fed.

As shown in FIG. 7, a larger overshoot is generated if the prescribed driving current Iop is small (Iop1) while a smaller overshoot is generated if the prescribed driving current Iop becomes larger (Iop2 and Iop3).

Next, feeding of the overshoot current and the undershoot current is described in detail.

FIG. 8A shows the basic configuration of a driver unit, and FIG. 8B shows a relationship between a changed portion ΔVgs in the gate voltage of the driver unit and the driving current.

As shown in FIG. 8A, assuming that the parasitic capacitance of the driving unit is C, a rising time is t, the overshoot current overlapped with the driving current is ΔI, and the changed portion of a gate voltage is ΔVgs, a relationship between them can be expressed by the following formula.

$$\Delta I \times t = C \times \Delta Vgs$$

It is clear from this formula that the changed portion ΔVgs of the gate voltage depends on the overshoot current ΔI because the parasitic capacitance C and the rising time t are constant. That is, as shown in FIG. 8B, since the changed portion ΔVgs of the gate voltage set to the driving current Iop is changed with the constant feeding of the overshoot current, the output waveform of the overshoot is changed. This also applies to the output waveform of the undershoot.

Further, the threshold current Ith, the light emitting current Iη, and the driving current Iop necessary for setting a light amount are changed depending on the type of a used semiconductor laser. Furthermore, even if the same type of a semiconductor laser is used, it has a large individual variation and is varied due to temperature or the like. Therefore, the driving current Iop is not constant even if the semiconductor laser is caused to emit a constant amount of light. For this reason, the overshoot current and the undershoot current must be changed according to the size of the driving current Iop.

Here, as shown in FIG. 8B, since the value of the gate voltage Vgs depends on transistor characteristics due to the settings of the driving current Iop, the driving current Iop and the gate voltage Vgs are not merely in a proportional relationship. Accordingly, the overshoot current and the undershoot current are not simply proportional to the driving current Iop.

Therefore, the present invention may have an object of providing a semiconductor driving unit capable of supplying a driving current having an ensured overshoot amount or an ensured undershoot amount to a semiconductor laser regardless of the size of the driving current.

Moreover, as shown in FIG. 9, the driving current Iop may be configured to include a bias current (referred to as Ibi) and a switching current (referred to as Isw).

FIG. 10 shows a relationship between the driving current Iop and the gate voltage Vgs according to a change in the bias current Ibi when the switching current Isw is constant.

If the same switching current Isw is supplied when the bias current Ibi is small (Ibi1) and the bias current Ibi is large (Ibi2), a comparison between the gate voltages ΔVgs1 and ΔVgs2 producing the driving currents Iop1 and Iop2, respectively, shows that the gate voltage ΔVgs2 is smaller than the gate voltage ΔVgs1. Therefore, the overshoot current must be decreased as the bias current Ibi increases when the switching current Isw is constant.

Also, in the case of the falling of the switching current Isw, the undershoot current must be decreased as the bias current Ibi increases.

Therefore, the present invention may have an object of providing the semiconductor laser driving unit capable of supplying a driving current having an ensured overshoot amount and/or an ensured undershoot amount to a semiconductor laser regardless of the size of a bias current.

Next, FIG. 11 shows a relationship between the driving current Iop and the gate voltage Vgs according to a change in the switching current Isw when the bias current Ibi is constant.

If the small switching current (Isw1) and the large switching current Isw (Isw2) are supplied with the bias current Ibi, a comparison between the gate voltages ΔVgs1 and ΔVgs2 producing the driving currents Iop1 and Iop2, respectively, shows that the gate voltage ΔVgs2 is greater than the gate voltage ΔVgs1. Therefore, the overshoot current must be increased as the switching current Isw increases when the bias current Ibi is constant.

Also, in the case of the falling of the switching current Isw, the undershoot current must be increased as the switching current Isw increases.

Therefore, the present invention may have an object of providing the semiconductor laser driving unit capable of supplying a driving current having an ensured overshoot amount or an ensured undershoot amount to a semiconductor laser regardless of the size of a switching current when a bias current is constant or regardless of the size of the bias current when the switching current is constant.

Further, the present invention may have an object of providing the semiconductor laser driving unit that supplies a driving current having an ensured overshoot amount or an ensured undershoot amount to a semiconductor laser regardless of the sizes of a bias current and a switching current.

Patent Document 1: JP-A-2001-096794
Patent Document 2: JP-A-2006-068933

SUMMARY OF THE INVENTION

In order to achieve the above objects, an embodiment of the present invention provides a semiconductor laser driving unit that outputs a driving current for driving a semiconductor laser.

In the semiconductor laser driving unit, a value of a correction current is set in such a manner as to determine a rising characteristic and/or a falling characteristic of an output of the driving current in accordance with a value of the driving current.

Other objects, features and advantages of the present invention will become more apparent from the following detailed description when read in conjunction with the accompanying drawings.

DETAILED DESCRIPTION OF THE PREFERRED EMBODIMENTS (Features of the Present Invention)

A semiconductor laser driving unit according to embodiments of the present invention has the feature of setting the value of a correction current that determines the rising characteristic of an output, i.e., an overshoot amount in accordance with the value of a driving current.

In addition, the semiconductor laser driving unit according to the embodiments of the present invention has the feature of determining the value of a correction current that determines the falling characteristic of an output, i.e., an undershoot amount in accordance with the value of a driving current.

(First Embodiment)

Figure 12:
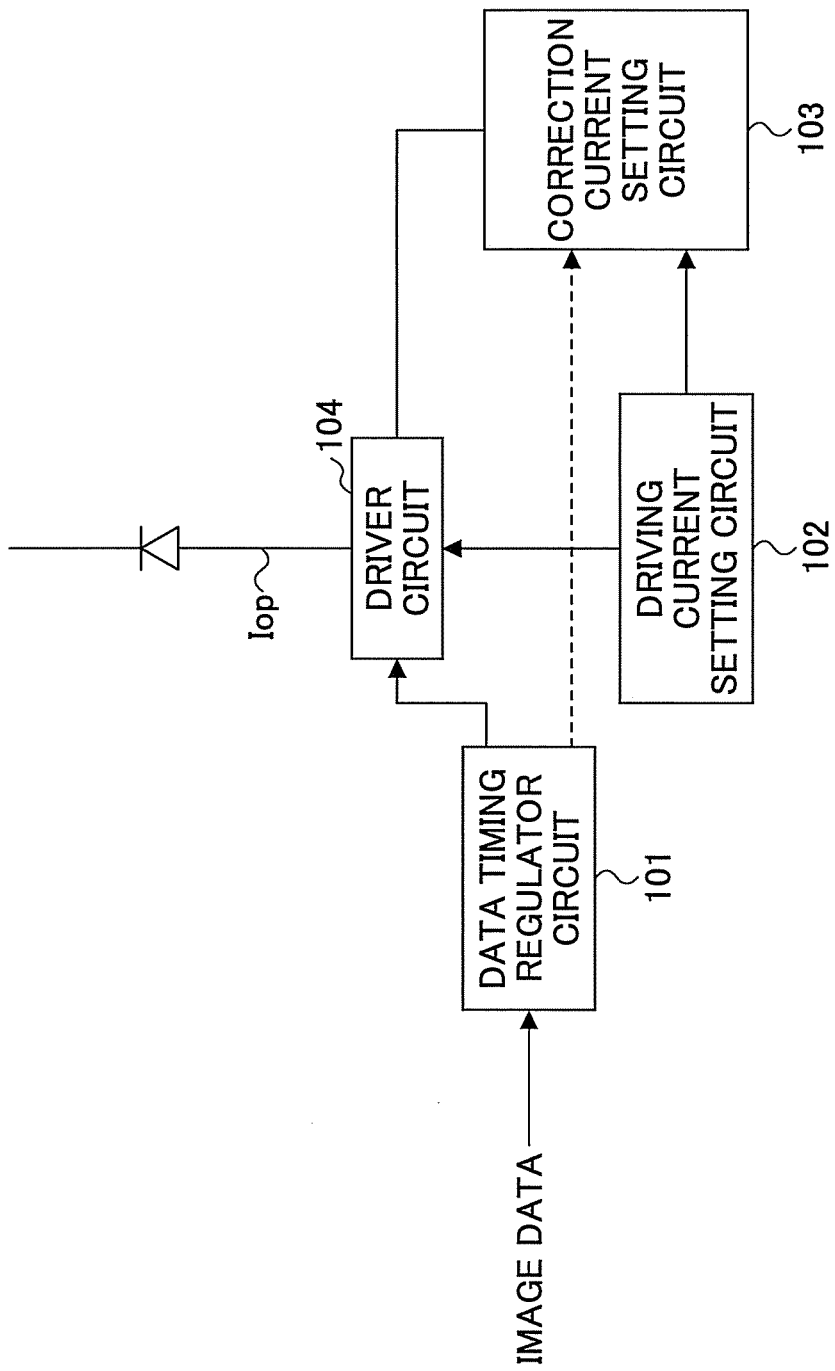
FIG. 12 is a diagram showing a circuit example according to a first embodiment of a semiconductor laser driving unit of the present invention.

FIG. 12 is a diagram showing a circuit example according to a first embodiment of the semiconductor laser driving unit of the present invention.

In FIG. 12, a driving current setting circuit 102 sets the value of a driving current (Iop) to be output from a driver circuit 104. Further, the driving current setting circuit 102 inputs the set value of the driving current to a correction current setting circuit 103. Then, the correction current setting circuit 103 determines an overshoot current and an undershoot current in accordance with the value of the driving current input from the driving current setting circuit 102 and inputs them to the driver circuit 104.

Figure 13:
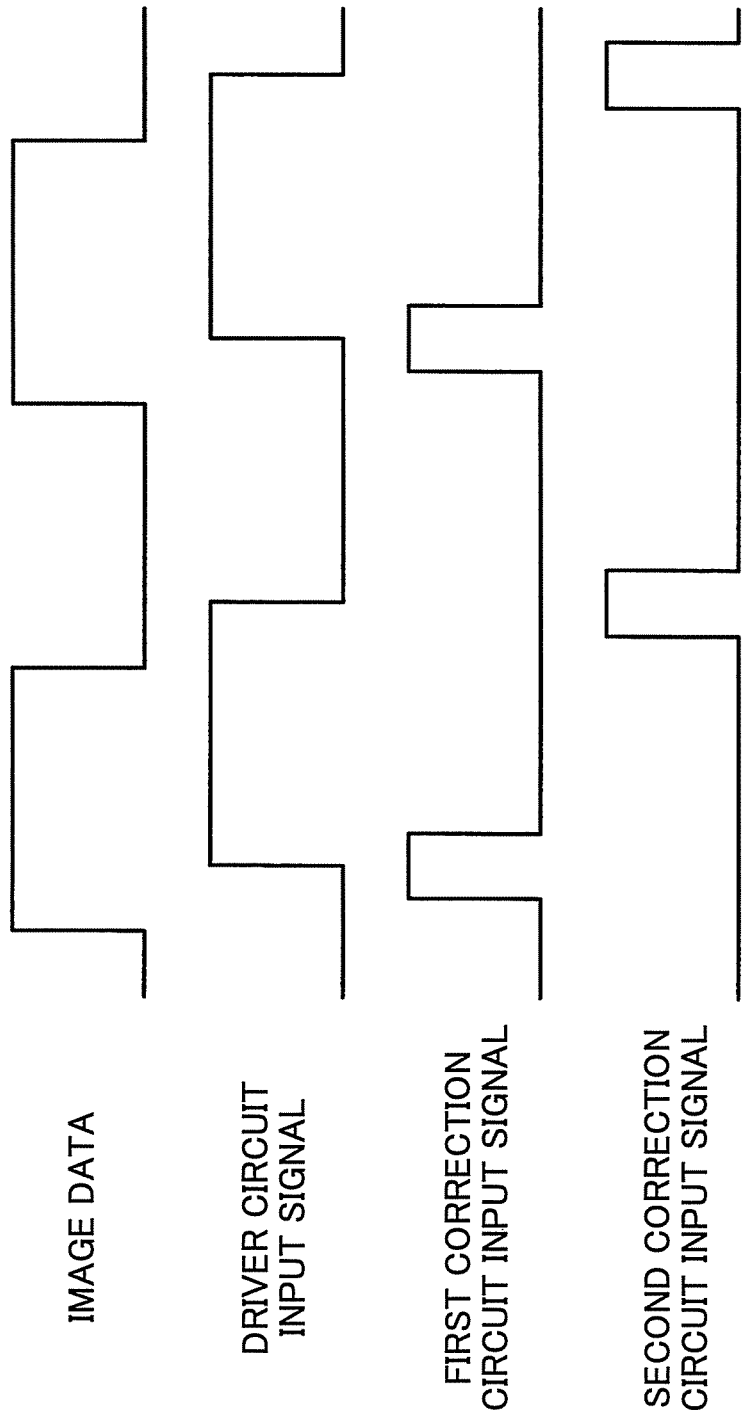
FIG. 13 is a diagram showing the waveforms of image data, a driver circuit input signal, a first correction circuit input signal, and a second correction circuit input signal according to the first embodiment of the semiconductor laser driving unit of the present invention.

FIG. 13 is a diagram showing the waveforms of image data, a driver circuit input signal, a first correction circuit input signal, and a second correction circuit input signal. As shown in FIG. 13, when the image data are input to a data timing regulator circuit 101, the driver circuit input signal obtained by delaying the input image data is input to the driver circuit 104 while the first correction circuit input signal turned on during a certain period at the rising of the driver circuit input signal and the second correction circuit input signal turned on during a certain period at the falling of the driver circuit input signal are input to the correction current setting circuit 103.

Upon receiving the driver circuit input signal shown in FIG. 13, the driver circuit 104 outputs the driving current Iop. Further, upon receiving the first correction circuit input signal shown in FIG. 13, the correction current setting circuit 103 inputs the overshoot current to the driver circuit 104. Further, upon receiving the second correction circuit input signal shown in FIG. 13, the correction current setting circuit 103 inputs the undershoot current to the driver circuit 104.

Figure 17:
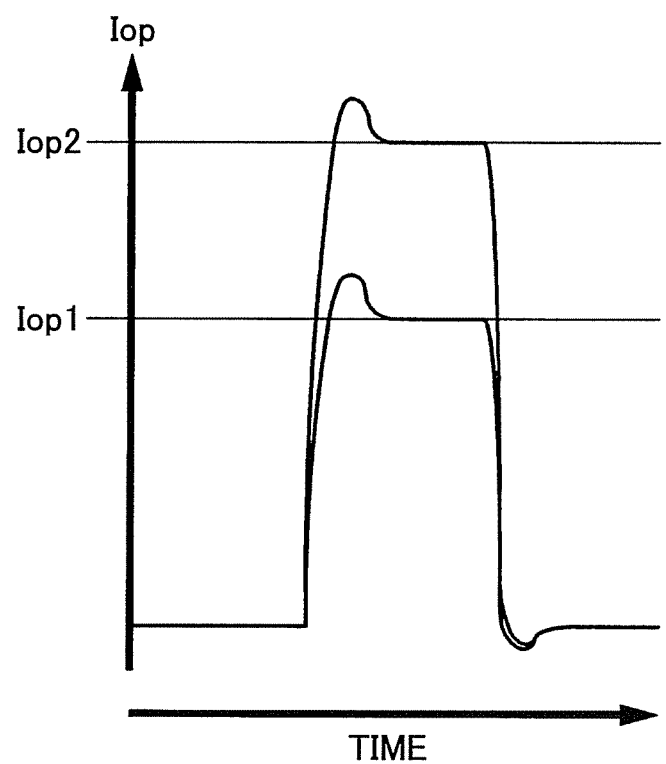
FIG. 17 is a graph showing that an output is obtained with the secured output of a driving current (Iop1, Iop2) regardless of the size of the driving current.

In the circuit shown in FIG. 12, even if the driving current setting circuit 102 sets driving currents to be output from the driver circuit 104 as a driving current Iop1 and a driving current Iop2 as shown in FIG. 17, the correction current setting circuit 103 regulates an overshoot current to provide the driving currents to be output from the driver circuit 104 with an ensured overshoot amount. Also in the case of an undershoot, the correction current setting circuit 103 regulates an undershoot current to provide the driving currents to be output from the driver circuit with an ensured undershoot amount.

Since the semiconductor laser driving unit according to this embodiment (FIG. 12) is configured to determine the value of a correction current in accordance with the value of a driving current, it can output a driving current having an ensured overshoot amount at the rising and/or falling of the driving current regardless of the size of the driving current.

More specifically, the correction current setting circuit 103 is configured to set the value of a correction current in accordance with the value of a driving current set by the driving current setting circuit 102, and the data timing regulator circuit 101 is configured to cause the driving current and the correction current to be output from the driver circuit 104 upon receiving input data. Therefore, the semiconductor laser driving unit according to this embodiment of the present invention can output the driving current having an ensured overshoot amount at the rising of the driving current and an ensured undershoot amount at the falling thereof regardless of the size of the driving current.

(Second Embodiment)

Figure 14:
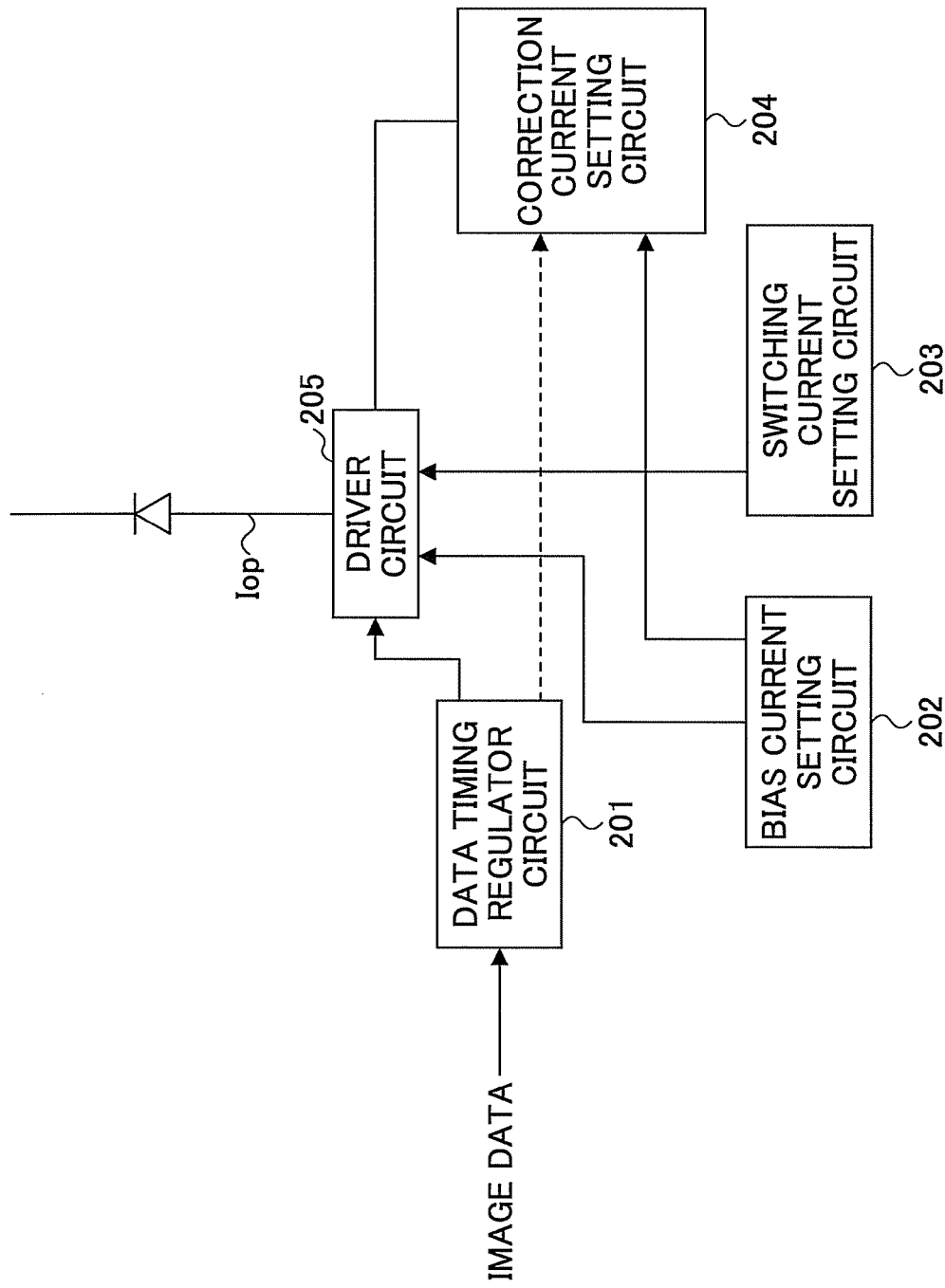
FIG. 14 is a diagram showing a circuit example according to a second embodiment of the semiconductor laser driving unit of the present invention.

FIG. 14 is a diagram showing a circuit example according to a second embodiment of the semiconductor laser driving unit of the present invention.

In FIG. 14, a driving current (Iop) to be output from a driver circuit 205 is configured to include a bias current (Ibi) and a switching current (Isw). A bias current setting circuit 202 sets the value of the bias current (Ibi), and a switching current setting circuit 203 sets the value of the switching current (Isw).

Here, the bias current setting circuit 202 sets the value of the bias current (Ibi) to be less than the value of a current as a threshold required when a semiconductor laser outputs coherent light. Further, the switching current setting circuit 203 sets the value of the switching current (Isw) to be added to the value of the bias current (Ibi) to be greater than the value of the current as the threshold required when the semiconductor laser outputs the coherent light. In other words, the ON/OFF state of the semiconductor laser is based on whether the switching current (Isw) is fed.

The bias current setting circuit 202 inputs the set value of the bias current to a correction current setting circuit 204. The correction current setting circuit 204 determines an overshoot current and an undershoot current in accordance with the value of the bias current input from the bias current setting circuit 202 and outputs them to the driver circuit 205.

As in the circuit example according to the first embodiment shown in FIG. 12, a data timing regulation circuit 201 inputs, upon receiving image data, the respective signals shown in FIG. 13 to the driver circuit 205 and the correction current setting circuit 204.

In the semiconductor laser driving unit according to this embodiment (FIG. 14) in which a driving current is configured to include a bias current and a switching current, the correction current setting circuit 204 is configured to set the value of a correction current in accordance with the value of a bias current set by the bias current setting circuit 202, and the data timing regulator circuit 201 is configured to cause the driving current and the correction current to be output from the driver circuit 205. Therefore, the semiconductor laser driving unit according to this embodiment of the present invention can output the driving current having an ensured overshoot amount at the rising of the driving current and an ensured undershoot amount at the falling thereof regardless of the size of the set bias current.

(Third Embodiment)

Figure 15:
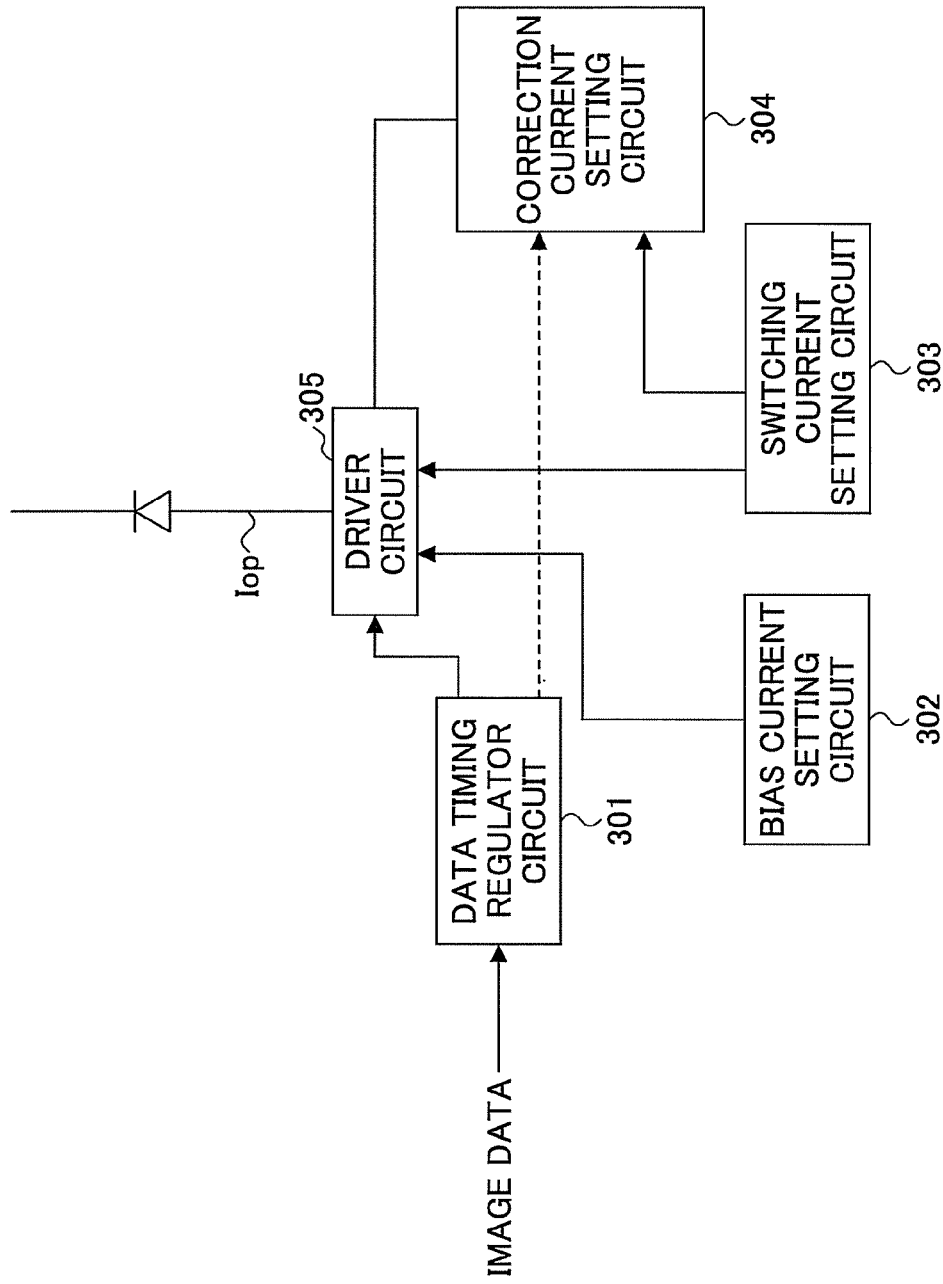
FIG. 15 is a diagram showing a circuit example according to a third embodiment of the semiconductor laser driving unit of the present invention.

FIG. 15 is a diagram showing a circuit example according to a third embodiment of the semiconductor laser driving unit of the present invention.

In FIG. 15, a driving current (Iop) to be output from a driver circuit 305 is configured to include a bias current (Ibi) and a switching current (Isw). A bias current setting circuit 302 sets the value of the bias current (Ibi), and a switching current setting circuit 303 sets the value of the switching current (Isw).

Here, the bias current setting circuit 302 sets the value of the bias current (Ibi) to be less than the value of a current as a threshold required when a semiconductor laser outputs coherent light. Further, the switching current setting circuit 303 sets the value of the switching current (Isw) to be added to the value of the bias current (Ibi) to be greater than the value of the current as the threshold required when the semiconductor laser outputs the coherent light. In other words, the ON/OFF state of the semiconductor laser is based on whether the switching current (Isw) is fed.

The switching current setting circuit 302 inputs the set value of the switching current to a correction current setting circuit 304. The correction current setting circuit 304 determines an overshoot current and an undershoot current in accordance with the value of the switching current input from the switching current setting circuit 303 and inputs them to the driver circuit 305.

As in the circuit example according to the first embodiment shown in FIG. 12, a data timing regulation circuit 301 inputs, upon receiving image data, the respective signals shown in FIG. 13 to the driver circuit 305 and the correction current setting circuit 304.

In the semiconductor laser driving unit according to this embodiment (FIG. 15) in which a driving current is configured to include a bias current and a switching current, the correction current setting circuit 304 sets the value of a correction current in accordance with the value of the switching current set by the switching current setting circuit 303, and the data timing regulator circuit 301 causes the driving current and the correction current to be output from the driver circuit 305. Therefore, the semiconductor laser driving unit according to this embodiment of the present invention can output the driving current having an ensured overshoot amount at the rising of the driving current and an ensured undershoot amount at the falling thereof regardless of the size of the set switching current.

(Fourth Embodiment)

Figure 16:
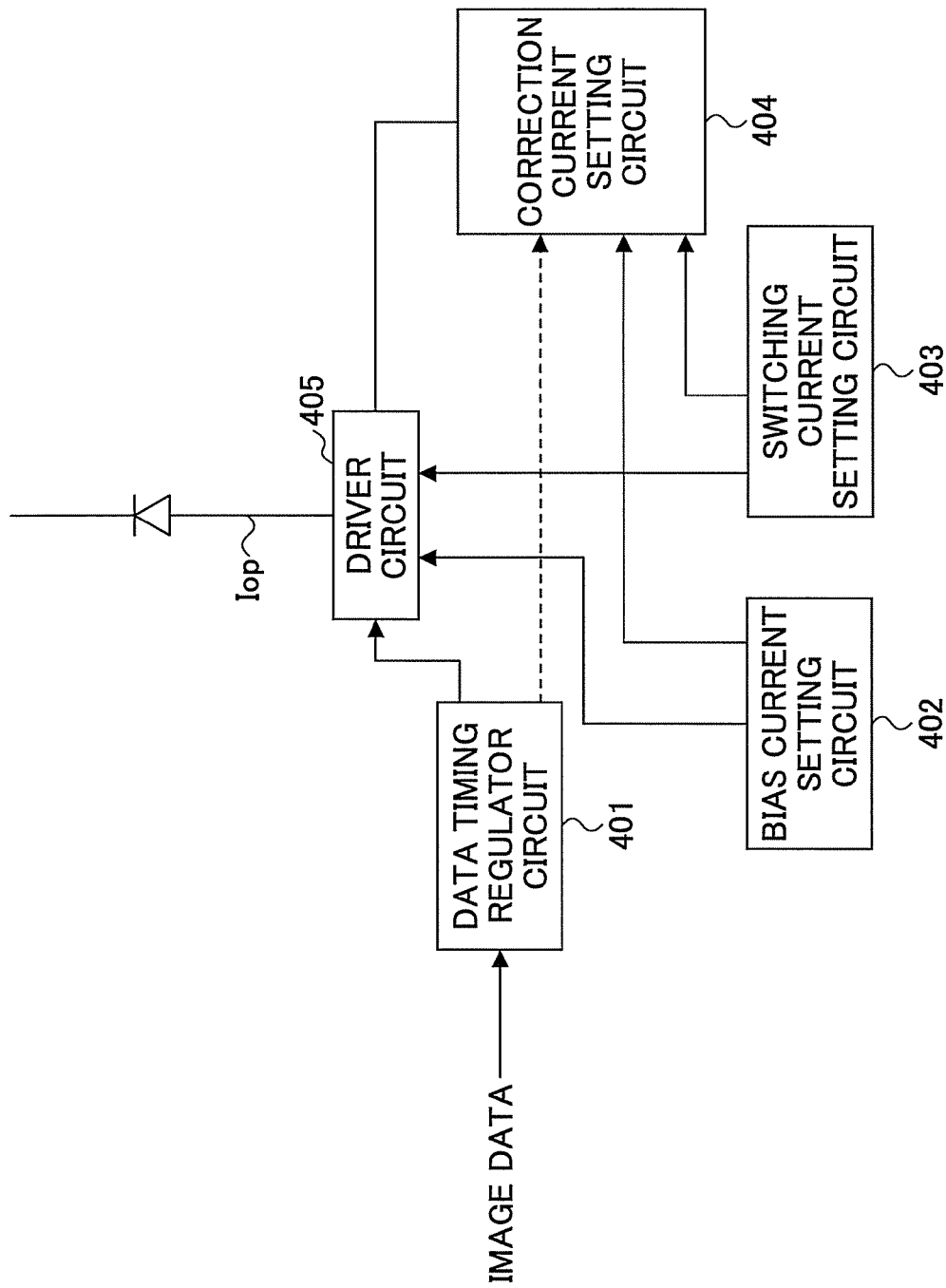
FIG. 16 is a diagram showing a circuit example according to a fourth embodiment of the semiconductor laser driving unit of the present invention.

FIG. 16 is a diagram showing a circuit example according to a fourth embodiment of the semiconductor laser driving unit of the present invention.

In FIG. 16, a driving current (Iop) to be output from a driver circuit 405 is configured to include a bias current (Ibi) and a switching current (Isw). A bias current setting circuit 402 sets the value of the bias current (Ibi), and a switching current setting circuit 403 sets the value of the switching current (Isw).

Here, the bias current setting circuit 402 sets the value of the bias current (Ibi) to be less than the value of a current as a threshold required when a semiconductor laser outputs coherent light. Further, the switching current setting circuit 403 sets the value of the switching current (Isw) to be added to the value of the bias current (Ibi) to be greater than the value of the current as the threshold required when the semiconductor laser outputs the coherent light. In other words, the ON/OFF state of the semiconductor laser is based on whether the switching current (Isw) is fed.

The bias current setting circuit 402 outputs the set value of the bias current to a correction current setting circuit 404.

Further, the switching current setting circuit 403 outputs the set value of the switching current to the correction current setting circuit 404. The correction current setting circuit 404 determines an overshoot current and an undershoot current in accordance with the values of the bias current and the switching current input from the bias current setting circuit 402 and the switching current setting circuit 403, respectively, and inputs them to the driver circuit 405.

As in the circuit example according to the first embodiment shown in FIG. 12, a data timing regulation circuit 401 inputs, upon receiving image data, the respective signals shown in FIG. 13 to the driver circuit 405 and the correction current setting circuit 404.

FIG. 17 shows that the above embodiment can provide the secured output of a driving current (Iop1, Iop2) regardless of the size of the driving current. It is clear from FIG. 17 that almost similar secured overshoot and undershoot are generated at the rising and the falling of the driving current, respectively, regardless of whether the driving current is small (Iop1) or large (Iop2).

In the semiconductor laser driving unit according to this embodiment (FIG. 16) in which a driving current is configured to include a bias current and a switching current, the correction current setting circuit 404 sets the value of a correction current in accordance with the value of a bias current set by the bias current setting circuit 402 and the value of a switching current set by the switching current setting circuit 403, and the data timing regulator circuit 401 causes the driving current and the correction current to be output from the driver circuit 405. Therefore, the semiconductor laser driving unit according to this embodiment of the present invention can output the driving current having an ensured overshoot amount at the rising of the driving current and an ensured undershoot amount at the falling thereof regardless of the sizes of the set bias current and the switching current.

(Fifth Embodiment)

Figure 18A:
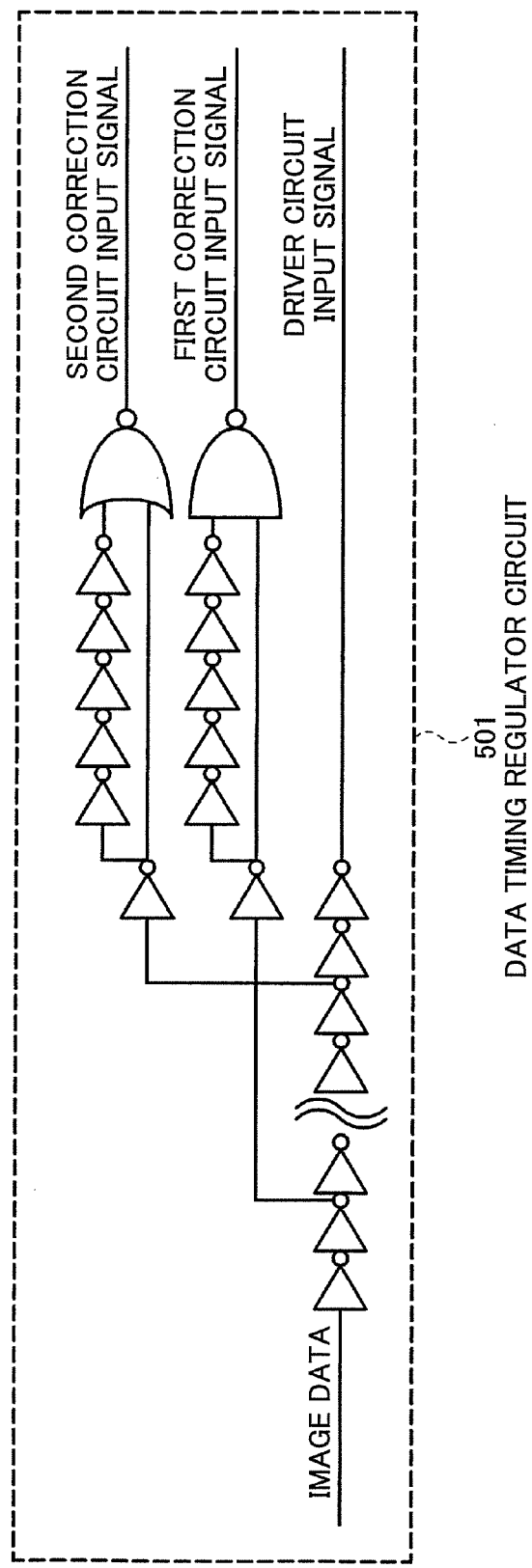
FIG. 18A is a diagram showing a circuit configuration example of a specific embodiment (fifth embodiment) for carrying out the present invention.
Figure 18B:
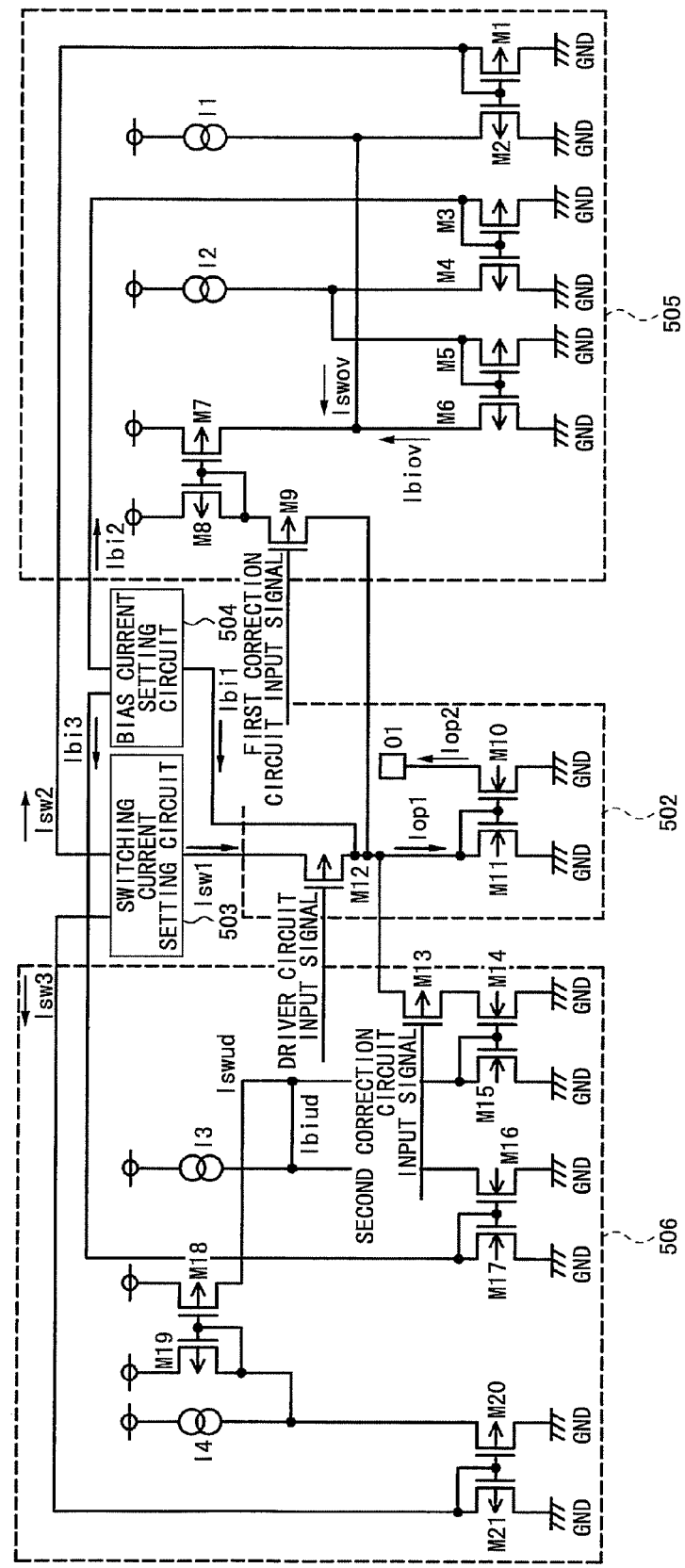
FIG. 18B is a diagram showing another circuit configuration example of the specific embodiment (fifth embodiment) for carrying out the present invention.

FIGS. 18A and 18B are examples of circuit configurations showing a specific embodiment (fifth embodiment) for carrying out the present invention.

FIGS. 18A and 18B show a semiconductor laser driving unit for an anode-type semiconductor laser (LD) as an example. More specifically, FIG. 18A shows a data timing regulator circuit 501, and FIG. 18B shows a driver circuit 502, a switching current setting circuit 503, a bias current setting circuit 504, a first correction current setting circuit 505, and a second correction current setting circuit 506.

In FIG. 18A, the data timing regulation circuit 501 outputs, upon receiving image data, a driver circuit input signal, a first correction circuit input signal, and a second correction circuit input signal shown in FIG. 13 to the driver circuit 502 and the correction current setting circuit 304, respectively.

In FIG. 18B, the switching current setting circuit 503 inputs the set value of a switching current Isw1 to the driver circuit 502, and the bias current setting circuit 504 inputs the set value of a bias current Ibi1 to the driver circuit 502. More specifically, the bias current setting circuit 504 inputs the value of the bias current Ibi1 to a transistor M11 of the driver circuit 502.

Further, the ON/OFF state of a transistor M12 of the driver circuit 502 is switched according to the driver circuit input signal input from the data timing regulator circuit 501. When the transistor M12 is turned on, the value of the switching current Isw1 is input to a transistor M11 of the driver circuit 502. The transistor M11 forms a current mirror with a transistor M10, and the value of a driving current Iop2 obtained by varying the power of the value of a driving current Iop1 input to the transistor M11 is output from an output 01.

Then, the bias current setting circuit 504 inputs the value of a bias current Ibi2 obtained by varying the power of the value of the bias current Ibi1 to the first correction current setting circuit 505, and the switching current setting circuit 503 inputs the value of a switching current Isw2 obtained by varying the power of the value of the switching current Isw1 to the first correction current setting circuit 505.

The value of the bias current Ibi2 is input to a transistor M3. The transistor M3 forms a current mirror with a transistor M4. The value of a current corresponding to a difference between the value of a constant current I2 and the value of a current obtained by varying the power of the value of the bias current Ibi2 is input to a transistor M5.

The transistor M5 forms a current mirror with a transistor M6, and the value of a bias current Ibiov obtained by varying the power of the value of the current input to the transistor M5 is input to a transistor M7. Accordingly, the first correction current setting circuit 505 is configured such that the value of a correction current is fed to the transistor M7 if the value of the bias current Ibi2 is less than or equal to a prescribed value, i.e., if the value of the current fed from the transistor M4 is less than or equal to the value of the constant current I2 and the value of the correction current is decreased as the value of the bias current Ibi2 increases.

Further, the value of the switching current Isw2 is input to a transistor M1. The transistor M1 forms a current mirror with a transistor M2, and the value of a switching current obtained by varying the power of the value of the switching current Isw2 is fed from the transistor M2. The value of a current Iswov corresponding to a difference between the value of a constant current I1 and the value of the switching current obtained by varying the power of the value of the switching current Isw2 is input to a transistor M7. Accordingly, the first correction current setting circuit 505 is configured such that the value of a correction current Iswov is not fed to the transistor M7 if the value of the switching current Isw2 is less than or equal to a prescribed value, i.e., if the value of the current fed from the transistor M2 is less than or equal to the value of the constant current I1 and the value of the correction current Iswov is increased as the value of the bias current Ibi2 increases.

The first correction circuit input signal from the data timing regulator circuit 501 is input to the gate of a transistor M9. Further, the value of a correction current obtained by varying the power of the value of a current value, in which the value of the bias current Ibiov and the value of the switching current Iswov are added together, with the transistor M7 and a transistor M8 is controlled by turning ON/OFF the transistor M9. The value of the correction current is input to the transistor M11 of the driver circuit 502 when the transistor M9 is turned ON. A driving current is output from the drain of the transistor M10 having a mirror connection with the transistor M11. In the manner described above, an overshoot current can be fed at the rising of image data.

Next, the bias current setting circuit 504 inputs the value of a bias current Ibi3 obtained by varying the power of the value of the bias current Ibi1 to the second correction current setting circuit 506, and the switching current setting circuit 503 outputs the value of a switching current Isw3 obtained by varying the power of the value of the switching current Isw1 to the second correction current setting circuit 506. Apart from the number of current mirrors formed by transistors, the basic operations of the second correction current setting circuit 506 are similar to those of the first correction setting circuit 505.

That is, the value of a correction current Ibiud becomes small if the value of the bias current Ibi3 is great, while the value of the correction current Ibiud becomes great if the value of the bias current Ibi3 is small. Further, the value of a correction current Iswud becomes great if the value of the switching current Isw3 is great, while the value of the correction current Iswud becomes small if the value of the switching current Isw3 is small.

The second correction circuit input signal from the data timing regulator circuit 501 is input to the gate of a transistor M12. Further, the value of a correction current obtained by varying the power of the value of a current value, in which the value of the bias current Ibiud and the value of the switching current Iswud are added together, with a transistor M14 and a transistor M15 is controlled by turning ON/OFF the transistor M12. The value of the correction current value is input to the transistor M11 when the transistor M12 is turned ON. A driving current is output from the drain of the transistor M10 having a mirror connection with the transistor M11. In the manner described above, an undershoot current can be fed at the falling of image data.

With the application of the circuits shown in FIGS. 18A and 18B, it is possible to regulate, without using resistors and capacitances as conventionally required, an ensured overshoot current and an ensured undershoot current depending on the sizes of bias currents and switching currents only by using transistors. In this embodiment, each of the overshoot current and the undershoot current is subjected to a primary correction. Correction accuracy is improved according to an increase in the number of primary correction circuits.

Note that the circuit configurations of the embodiment shown in FIGS. 18A and 18B are merely the examples and not necessarily required for regulating correction currents that determine an ensured rising characteristic or an ensured falling characteristic as the object of the present invention. Rather, the circuit configurations can be flexibly set according to the characteristics of transistors or the like.

Note that the above embodiment refers to the semiconductor laser driving unit for an anode-type semiconductor laser but may also be applied to a semiconductor laser driving unit for a cathode-type semiconductor laser.

Figure 1:
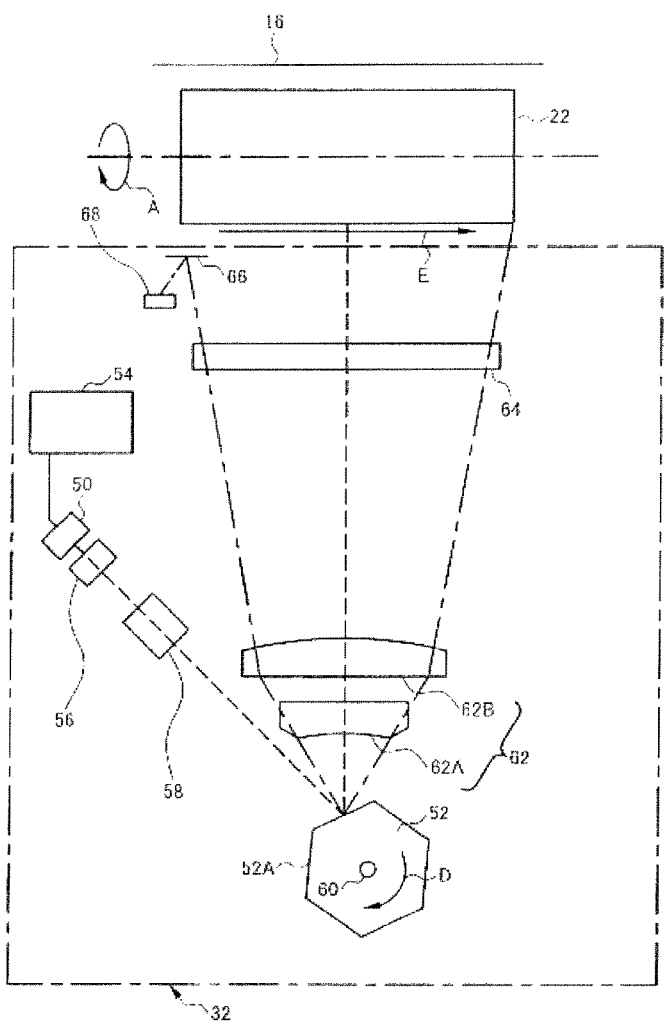
FIG. 1 is a diagram showing an image forming apparatus described in JP-A-2001-096794 (Patent Document 1)
Figure 2:
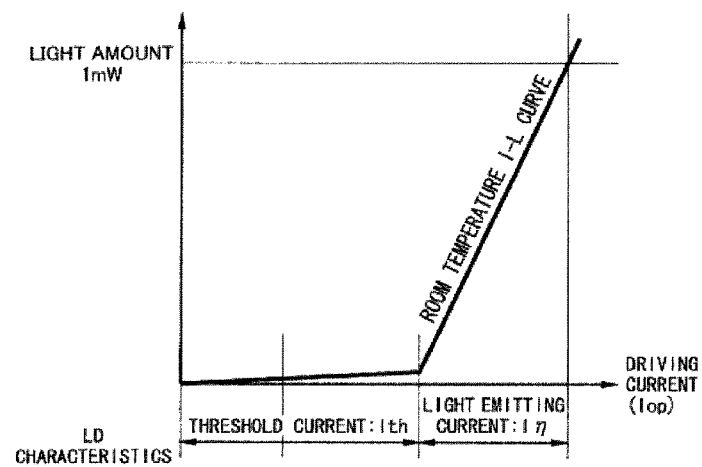
FIG. 2 is a graph showing a relationship between the driving current of a semiconductor laser and the amount of light output from the semiconductor laser.
Figure 3:
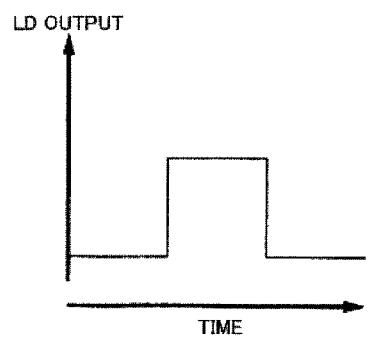
FIG. 3 is a graph showing an ideal rectangular waveform of the semiconductor laser.
Figure 4:
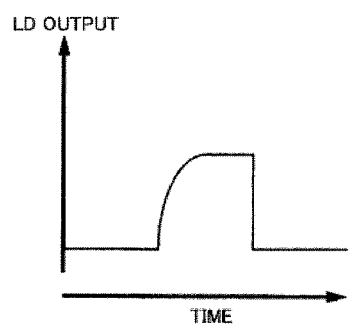
FIG. 4 is a graph showing the light output waveform of the semiconductor laser when a distortion occurs in the driving current.
Figure 5:
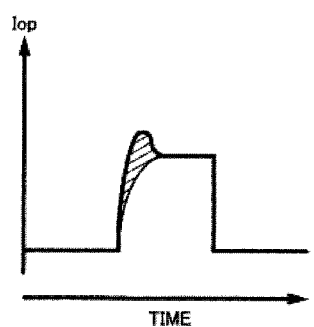
FIG. 5 is a graph showing the waveform of the driving current when an overshoot is generated.
Figure 6:
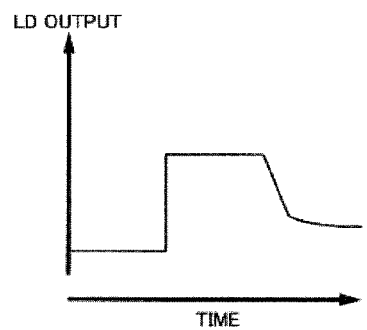
FIG. 6 is a graph showing the light output waveform of the semiconductor laser in a case where the driving current becomes blunt at its fall.
Figure 7:
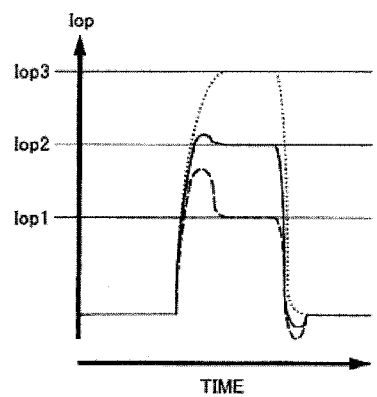
FIG. 7 is a graph showing output waveforms corresponding to the respective sizes (Iop1, Iop2, and Iop3) of a prescribed driving current Iop when a constant overshoot current and a constant undershoot current are fed.
Figure 8A:
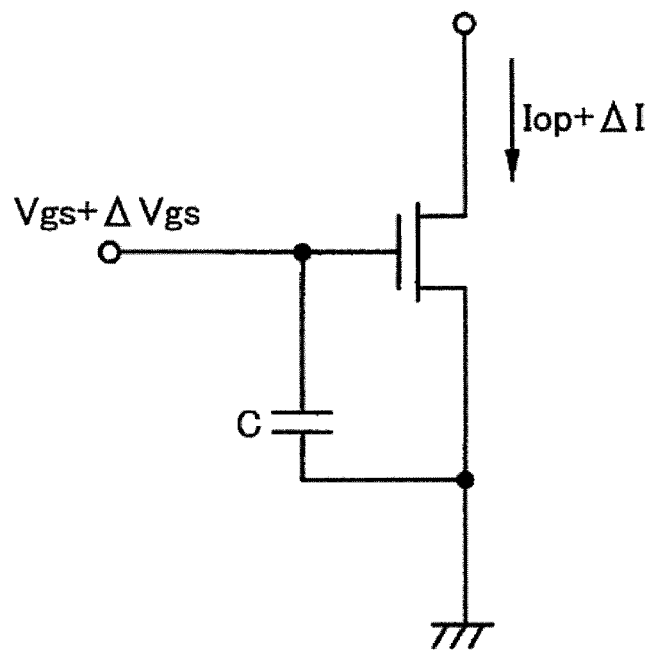
FIG. 8A is a diagram showing the basic configuration of a driver unit.
Figure 8B:
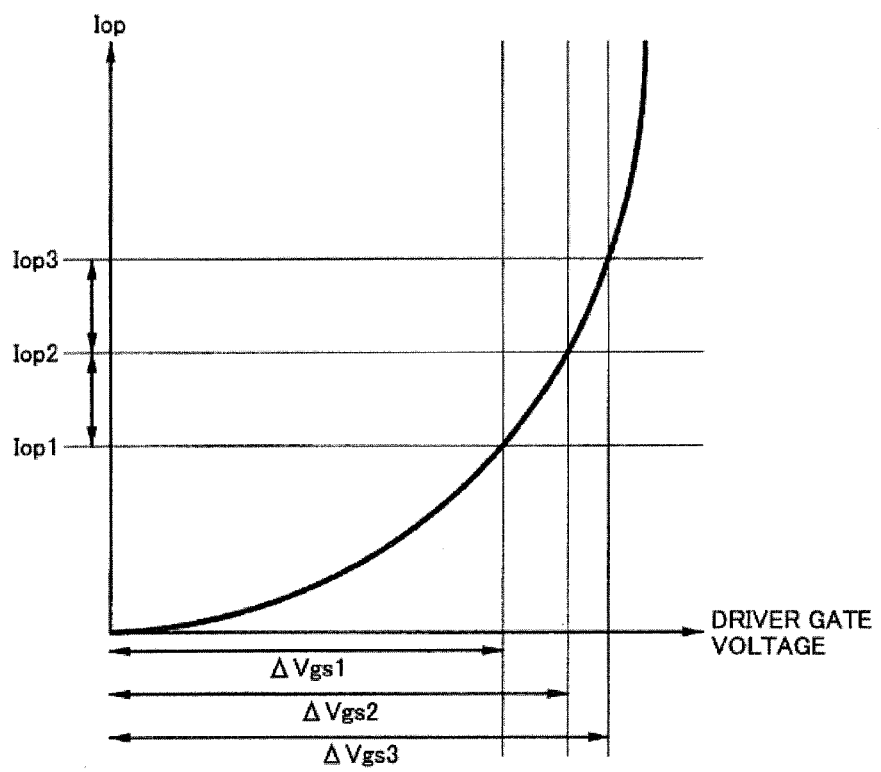
FIG. 8B is a graph showing a relationship between a changed portion ΔVgs in the gate voltage of the driver unit and the driving current.
Figure 9:
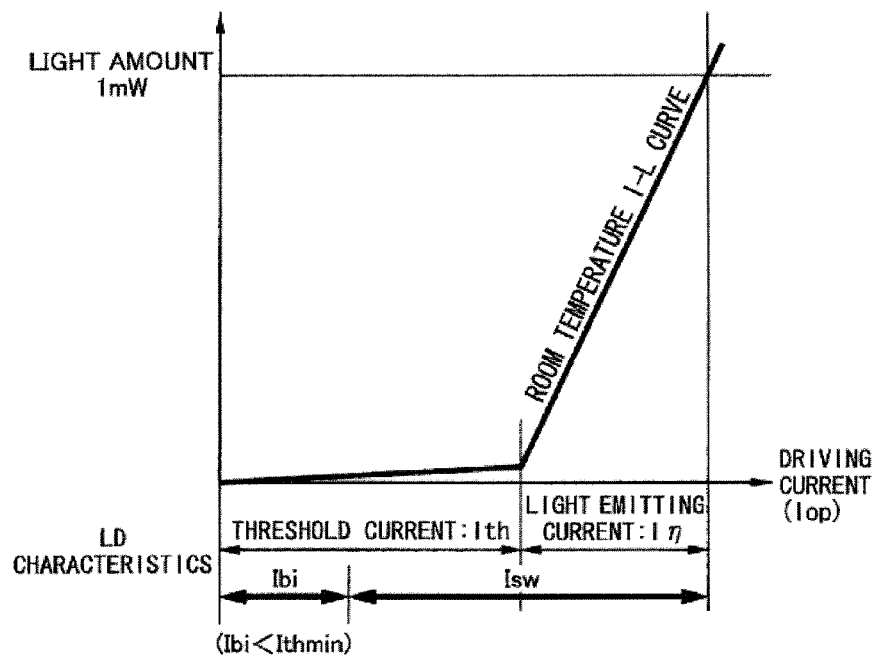
FIG. 9 is a graph showing a relationship between the driving current and the amount of light output when the driving current Iop is configured to include a bias current (Ibi) and a switching current (Isw)
Figure 10:
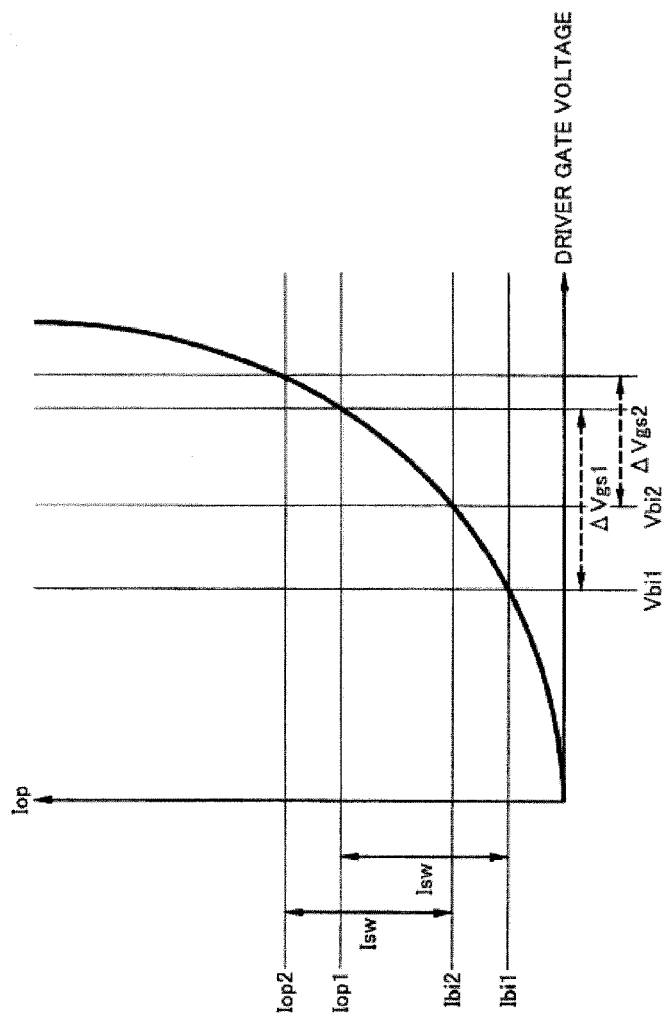
FIG. 10 is a graph showing a relationship between the driving current Iop and the gate voltage Vgs according to a change in the bias current Ibi when the switching current Isw is constant.
Figure 11:
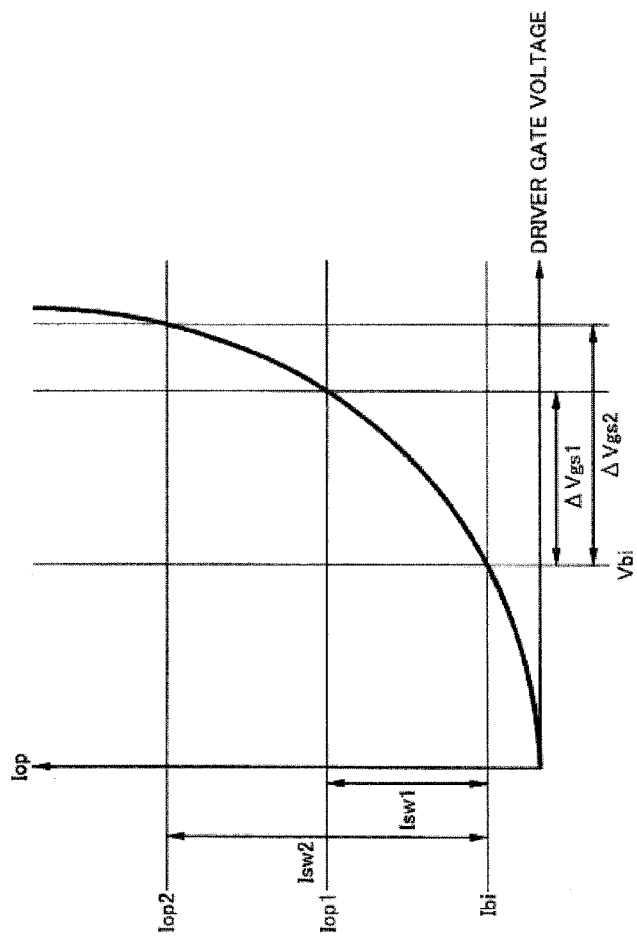
FIG. 11 shows a relationship between the driving current Iop and the gate voltage Vgs according to a change in the switching current Isw when the bias current Ibi is constant.

Further, the semiconductor laser driving unit described in the above embodiment may be applied to various apparatuses using a semiconductor laser but is particularly effective when applied to the optical scanner (semiconductor laser scanner) and the image forming apparatus described in FIG. 1.

According to this embodiment, the semiconductor laser driving unit as described above is configured to drive a semiconductor laser with a driving current having an ensured overshoot amount at the rising of the driving current and an ensured undershoot amount at the falling thereof in accordance with the value of a driving current. Therefore, it is possible to realize an optical scanner and an image forming apparatus that operate in an ensured manner regardless of the size of a driving current.

The present invention is not limited to the specifically disclosed embodiments, and variations and modifications may be made without departing from the scope of the present invention.

The present application is based on Japanese Priority Application No. 2010-061896 filed on Mar. 18, 2010, the entire contents of which are hereby incorporated herein by reference.

What is claimed is:

1. A semiconductor laser driving unit that outputs a driving current for driving a semiconductor laser, comprising:
    a driving current setting circuit that sets a value of the driving current;
    a correction current setting circuit that determines an overshoot current and an undershoot current based on the value of the driving current set by the driving current setting circuit and sets a value of a correction current based on said overshoot current and said undershoot current;
    a data timing regulator circuit that regulates a timing for outputting the driving current and the correction current based on input image data; and
    a driver circuit that outputs the driving current and the correction current.

2. An optical scanner comprising the semiconductor laser driving unit according to claim 1.

3. An image forming apparatus comprising the optical scanner according to claim 2.

4. An image forming apparatus comprising the semiconductor laser driving unit according to claim 1.

5. A semiconductor laser driving unit that outputs a driving current for driving a semiconductor laser, comprising:
    a driving current setting circuit that sets a value of the driving current;
    a correction current setting circuit that sets a value of a correction current used to determine a rising characteristic and/or a falling characteristic of the output;
    a data timing regulator circuit that regulates a timing for outputting the driving current and the correction current based on input image data; and
    a driver circuit that outputs the driving current and the correction current, wherein
    the data timing regulator circuit generates based on the input image data, and outputs to the driver circuit, a driver circuit input signal, and
    the data timing regulator circuit generates, and outputs to the correction current setting circuit, (i) a first correction circuit input signal that is turned on during a time period in which the driver circuit input signal is rising and (ii) a second correction circuit input signal that is turned on during a time period in which the driver circuit input signal is falling, and
    the correction current setting circuit, upon receiving the first correction circuit input signal, inputs an overshoot current to the driver circuit, and upon receiving the second correction circuit input signal inputs an undershoot current to the driver circuit.

6. The semiconductor laser driving unit according to claim 5, wherein
    the driving current is configured to include a bias current and a switching current,
    the semiconductor laser driving unit further comprises a bias current setting circuit that sets a value of the bias current and a switching current setting circuit that sets a value of the switching current, and
    the correction current setting circuit sets the value of the correction current in accordance with the value of the bias current set by the bias current setting circuit.

7. The semiconductor laser driving unit according to claim 6, wherein
    the bias current is set to be less than a threshold current required when the semiconductor laser outputs coherent light, and
    the switching current is set to be added to the bias current to be greater than the threshold current required when the semiconductor laser outputs the coherent light.

8. The semiconductor laser driving unit according to claim 5, wherein
    the driving current is configured to include a bias current and a switching current, the semiconductor laser driving unit further comprises a bias current setting circuit that sets a value of the bias current and a switching current setting circuit that sets a value of the switching current, and the correction current setting circuit sets the value of the correction current in accordance with the value of the switching current.

9. The semiconductor laser driving unit according to claim 5, wherein the driving current is configured to include a bias current and a switching current, the semiconductor laser driving unit further comprises a bias current setting circuit that sets a value of the bias current and a switching current setting circuit that sets a value of the switching current, and the correction current setting circuit sets the value of the correction current n accordance with the values of the bias current and the switching current.

10. The semiconductor laser driving unit according to claim 9, wherein the correction current setting circuit comprises
a fast correction current setting circuit that sets a value of a correction current at a rising time and
a second correction current setting circuit that sets a value of a correction current at a falling time, the first correction current setting circuit and the second correction current setting circuit each setting the value of the correction current in accordance with the values of the bias current and the switching current.

* * * * *